US006228436B1

(12) United States Patent
Affinito

(10) Patent No.: US 6,228,436 B1
(45) Date of Patent: *May 8, 2001

(54) METHOD OF MAKING LIGHT EMITTING POLYMER COMPOSITE MATERIAL

(75) Inventor: John D. Affinito, Kennewick, WA (US)

(73) Assignee: Battelle Memorial Institute, Richland, WA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/212,926

(22) Filed: Dec. 16, 1998

(51) Int. Cl.$^7$ .................................................. B05D 3/06
(52) U.S. Cl. .................... 427/497; 427/551; 427/553; 427/562; 427/595; 427/255.6; 427/294; 427/398.1; 427/421
(58) Field of Search ........................ 427/497, 551, 427/553, 562, 595, 248.1, 255.6, 255.7, 294, 398.1, 421

(56) References Cited

U.S. PATENT DOCUMENTS

| | | |
|---|---|---|
| 3,475,307 | 10/1969 | Knox et al. . |
| 3,607,365 | 9/1971 | Lindlof . |
| 4,098,965 | 7/1978 | Kinsman . |
| 4,283,482 | 8/1981 | Hattori et al. . |
| 4,581,337 | 4/1986 | Frey et al. . |
| 4,624,867 | 11/1986 | Iijima et al. . |
| 4,695,618 | 9/1987 | Mowrer . |
| 4,842,893 | 6/1989 | Yializis et al. ........................ 427/44 |
| 4,954,371 | 9/1990 | Yializis ................................. 427/44 |
| 5,032,461 | 7/1991 | Shaw et al. . |

(List continued on next page.)

FOREIGN PATENT DOCUMENTS

| | | |
|---|---|---|
| 704 297 | 2/1968 | (BE) . |
| 196 03 746 | 4/1997 | (DE) . |

(List continued on next page.)

OTHER PUBLICATIONS

PCT International Search Report for International application No. PCT/US 99/29844 dated Sep. 5, 2000.

G Gustafson, Y. Cao, G.M. Treacy, F. Klavetter, N. Colaneri and A.J. Heeger, Nature, vol. 35, Jun. 11, 1992, pp. 477–479.

J.D. Affinito, M.E. Gross, C.A. Coronado, G.L. Graff, E.N. Greenwell, and P.M. Martin, *Polymer–Oxide Transparent Barrier Layers Produced Using The PML Process*, 39$^{th}$ Annual Technical Conference Proceedings of the Society of Vacuum Coaters, Vacuum Web Coating Session, 1996, pp. 392–397.

(List continued on next page.)

*Primary Examiner*—Erma Cameron
(74) *Attorney, Agent, or Firm*—Killworth, Gottman, Hagan & Schaeff LLP

(57) ABSTRACT

The method of the present invention for making a light emitting polymer has the steps of (a) flash evaporating a coating material monomer together with light emitting particles in an evaporate outlet forming an evaporate; (b) cryocondensing the evaporate; and (c) crosslinking the condensed evaporate. The evaporate may be passed to a glow discharge electrode creating a glow discharge monomer plasma from the evaporate; then (d) cryocondensing the glow discharge monomer plasma on the surface and crosslinking the glow discharge monomer plasma thereon, wherein the crosslinking results from radicals created in the glow discharge monomer plasma and achieves self curing.

8 Claims, 3 Drawing Sheets

U.S. PATENT DOCUMENTS

| | | |
|---|---|---|
| 5,237,439 | 8/1993 | Misono et al. . |
| 5,260,095 | 11/1993 | Affinito .................................. 427/124 |
| 5,354,497 | 10/1994 | Fukuchi et al. . |
| 5,395,644 | 3/1995 | Affinito . |
| 5,427,638 | 6/1995 | Goetz et al. . |
| 5,440,446 | 8/1995 | Shaw et al. . |
| 5,536,323 | 7/1996 | Kirlin et al. . |
| 5,547,508 * | 8/1996 | Affinito .................................. 118/50 |
| 5,554,220 | 9/1996 | Forrest et al. . |
| 5,576,101 | 11/1996 | Saitoh et al. . |
| 5,607,789 | 3/1997 | Treger et al. . |
| 5,620,524 | 4/1997 | Fan et al. . |
| 5,629,389 | 5/1997 | Roitman et al. . |
| 5,654,084 | 8/1997 | Egert . |
| 5,681,615 | 10/1997 | Affinito et al. .................... 427/255.6 |
| 5,681,666 | 10/1997 | Treger et al. . |
| 5,684,084 | 11/1997 | Lewin et al. . |
| 5,686,360 | 11/1997 | Harvey, III et al. . |
| 5,693,956 | 12/1997 | Shi et al. . |
| 5,711,816 | 1/1998 | Kirlin et al. . |
| 5,725,909 | 3/1998 | Shaw et al. . |
| 5,731,661 | 3/1998 | So et al. . |
| 5,747,182 | 5/1998 | Friend et al. . |
| 5,757,126 | 5/1998 | Harvey, III et al. . |
| 5,759,329 | 6/1998 | Krause et al. . |
| 5,792,550 | 8/1998 | Phillips et al. . |
| 5,811,177 | 9/1998 | Shi et al. . |
| 5,811,183 | 9/1998 | Shaw et al. . |
| 5,821,692 | 10/1998 | Rogers et al. . |
| 5,844,363 | 12/1998 | Gu et al. .............................. 313/506 |
| 5,872,355 | 2/1999 | Hueschen . |
| 5,902,641 * | 5/1999 | Affinito et al. .................... 427/255.2 |
| 5,902,688 | 5/1999 | Antoniadis et al. . |
| 5,904,958 | 5/1999 | Dick et al. . |
| 5,912,069 | 6/1999 | Yializis et al. . |
| 5,922,161 | 7/1999 | Wu et al. . |
| 5,945,174 | 8/1999 | Shaw et al. . |
| 5,948,552 | 9/1999 | Antoniadis et al. . |
| 5,965,907 | 10/1999 | Huang et al. . |
| 5,996,498 | 12/1999 | Lewis . |
| 6,045,864 | 4/2000 | Lyons et al. . |
| 6,083,628 | 7/2000 | Yializis . |

FOREIGN PATENT DOCUMENTS

| | | |
|---|---|---|
| 0 299 753 | 1/1989 | (EP) . |
| 0 340 935 | 11/1989 | (EP) . |
| 0 547 550 | 6/1993 | (EP) . |
| 0 590 467 | 4/1994 | (EP) . |
| 0 390 540 | 8/1994 | (EP) . |
| 0 722 787 | 7/1996 | (EP) . |
| 0 787 826 | 8/1997 | (EP) . |
| 0 916 394 | 5/1999 | (EP) . |
| 0 931 850 | 7/1999 | (EP) . |
| 0 977 469 | 2/2000 | (EP) . |
| 63-136316 | 6/1988 | (JP) . |
| 64-18441 | 1/1989 | (JP) . |
| 2-183230 | 7/1990 | (JP) . |
| 08325713 | 12/1996 | (JP) . |
| 09059763 | 3/1997 | (JP) . |
| WO 87/07848 | 12/1987 | (WO) . |
| WO 95/10117 | 4/1995 | (WO) . |
| WO 97 04885 | 2/1997 | (WO) . |
| WO 97/22631 | 6/1997 | (WO) . |
| WO 98 10116 | 3/1998 | (WO) . |
| WO 98/18852 | 5/1998 | (WO) . |
| WO 99 16557 | 4/1999 | (WO) . |
| WO 99 16931 | 4/1999 | (WO) . |

OTHER PUBLICATIONS

J.D. Affinito, Stephan, Eufinger, M.E. Gross, G.L. Graff, and P.M. Martin, *PML/Oxide/PML Barrier Layer Performance Differences Arising From Use of UV or Electron Beam Polymerization of the PML Layers*, Thin Solid Films, vol. 308, 1997, pp. 19–25.

Affinito J.D. et al., "High rate vacuum deposition of polymer electrolytes" Journal Vacuum Science Technology A 14(3), May/Jun. 1996, pp. 733–738.

Inoue A et al., "Fabrication of a Thin Film of MNA by Vapour Deposition" Proc. Jpn. Congr. Mater. Res., vol. 33, 1990, pp. 177–179.

Affinito J.D. et al., "Vacuum Deposition Of Polymer Electrolytes On Flexible Substrates" Proceedings of the Ninth International Conference on Vacuum Web Coating, Nov. 1995, ed R. Bakish, Bakish Press 1995, pp. 20–36.

Penning F.M., "Electrical Discharges in Gases" Gordon and Breach, Science Publishers, 1965, Chapters 5–6, pp. 19–35; and Chapter 8, pp. 41–50.

Vossen J.L. et al., editors, "Thin Film Processes" Academic Press, 1978, Part II, Chapter II–1, Glow Discharge Sputter Deposition, pp. 12–63; Part IV, Chapter IV–1, Plasma Deposition of Inorganic Thin Films, pp. 335–360 and Chapter IV–2, Glow Discharge Polymerization, pp. 361–397.

* cited by examiner

METHOD OF MAKING LIGHT EMITTING POLYMER COMPOSITE MATERIAL

FIELD OF THE INVENTION

The present invention relates generally to a method of making composite polymer films. More specifically, the present invention relates to making a composite polymer film from a mixture having insoluble particles in a liquid monomer. Additional layers of polymer or metal may be added under vacuum as well.

As used herein, the term "(meth)acrylic" is defined as "acrylic or methacrylic". Also, "(meth)acrylate" is defined as "acrylate or methacrylate".

As used herein, the term "cryocondense" and forms thereof refers to the physical phenomenon of a phase change from a gas phase to a liquid phase upon the gas contacting a surface having a temperature lower than a dew point of the gas.

As used herein, the term "conjugated" refers to a chemical structure of alternating single and double bonds between carbon atoms in a carbon atom chain.

As used herein, the term "composite polymer" is a polymer having two distinct phases wherein a first phase is substantially continuous and encompasses "islands" of a second phase from the molecular level to molecular aggregate level. The "islands" of the second phase may touch and/or the two phases may be unlinked or linked, but do not provide a continuous conjugated network. Hence, any conjugation present in the composite polymer is insufficient to render the composite polymer electrically conductive even in the presence of a dopant (iodine or salt).

BACKGROUND OF THE INVENTION

The basic process of plasma enhanced chemical vapor deposition (PECVD) is described in THIN FILM PROCESSES, J. L. Vossen, W. Kern, editors, Academic Press, 1978, Part IV, Chapter IV-1 Plasma Deposition of Inorganic Compounds, Chapter IV-2 Glow Discharge Polymerization, herein incorporated by reference. Briefly, a glow discharge plasma is generated on an electrode that may be smooth or have pointed projections. Traditionally, a gas inlet introduces high vapor pressure monomeric gases into the plasma region wherein radicals are formed so that upon subsequent collisions with the substrate, some of the radicals in the monomers chemically bond or cross link (cure) on the substrate. The high vapor pressure monomeric gases include gases of $CH_4$, $SiH_4$, $C_2H_6$, $C_2H_2$, or gases generated from high vapor pressure liquid, for example styrene (10 torr at 87.4 EF (30.8 EC)), hexane (100 torr at 60.4 EF (15.8 EC)), tetramethyldisiloxane (10 torr at 82.9 EF (28.3 EC) 1,3,-dichlorotetra-methyidisiloxane) and combinations thereof that may be evaporated with mild controlled heating. Because these high vapor pressure monomeric gases do not readily cryocondense at ambient or elevated temperatures, deposition rates are low (a few tenths of micrometer/min maximum) relying on radicals chemically bonding to the surface of interest instead of cryocondensation. Remission due to etching of the surface of interest by the plasma competes with reactive deposition. Lower vapor pressure species have not been used in PECVD because heating the higher molecular weight monomers to a temperature sufficient to vaporize them generally causes a reaction prior to vaporization, or metering of the gas becomes difficult to control, either of which is inoperative.

The basic process of flash evaporation is described in U.S. Pat. No. 4,954,371 herein incorporated by reference. This basic process may also be referred to as polymer multi-layer (PML) flash evaporation. Briefly, a radiation polymerizable and/or cross linkable material is supplied at a temperature below a decomposition temperature and polymerization temperature of the material. The material is atomized to droplets having a droplet size ranging from about 1 to about 50 microns. An ultrasonic atomizer is generally used. The droplets are then flash vaporized, under vacuum, by contact with a heated surface above the boiling point of the material, but below the temperature which would cause pyrolysis. The vapor is cryocondensed on a substrate then radiation polymerized or cross linked as a very thin polymer layer.

According to the state of the art of making plasma polymerized films, PECVD and flash evaporation or glow discharge plasma deposition and flash evaporation have not been used in combination. However, plasma treatment of a substrate using glow discharge plasma generator with inorganic compounds has been used in combination with flash evaporation under a low pressure (vacuum) atmosphere as reported in J. D. Affinito, M. E. Gross, C. A. Coronado, and P. M. Martin, A Vacuum Deposition Of Polymer Electrolytes On Flexible Substrates. "Paper for Plenary talk in A Proceedings of the Ninth International Conference on Vacuum Web Coating", November 1995 ed R. Bakish, Bakish Press 1995, pg 20–36., and as shown in FIG. 1a. In that system, the plasma generator 100 is used to etch the surface 102 of a moving substrate 104 in preparation to receive the monomeric gaseous output from the flash evaporation 106 that cryocondenses on the etched surface 102 and is then passed by a first curing station (not shown), for example electron beam or ultra-violet radiation, to initiate cross linking and curing. The plasma generator 100 has a housing 108 with a gas inlet 110. The gas may be oxygen, nitrogen, water or an inert gas, for example argon, or combinations thereof. Internally, an electrode 112 that is smooth or having one or more pointed projections 114 produces a glow discharge and makes a plasma with the gas which etches the surface 102. The flash evaporator 106 has a housing 116, with a monomer inlet 118 and an atomizing nozzle 120, for example an ultrasonic atomizer. Flow through the nozzle 120 is atomized into particles or droplets 122 which strike the heated surface 124 whereupon the particles or droplets 122 are flash evaporated into a gas that flows past a series of baffles 126 (optional) to an outlet 128 and cryocondenses on the surface 102. Although other gas flow distribution arrangements have been used, it has been found that the baffles 126 provide adequate gas flow distribution or uniformity while permitting ease of scaling up to large surfaces 102. A curing station (not shown) is located downstream of the flash evaporator 106. The monomer may be an (meth)acrylate (FIG. 1b).

Organic light emitting devices (OLED) may be long chain conjugated polymers with molecular weights on the order of $10^5$ dalton, or small molecules, for example, aluminum quinolinolato, quinacridone or triphenyl diamine derivitive. Fabrication of OLED with small molecules has been with (1) conventional electron beam or thermal, evaporation or sublimation of a solid small molecule material from a crucible; (2) spin coating of the small molecule material suspended in a solution of solvent and a polymeric binder followed by removal of the solvent; and (3) spin coating as for (2) but with a polymeric electrolyte binder. The evaporation/sublimation methods produce a film that is substantially composed of the light emitting small molecule. These methods offer high deposition rates, and other advantages, but suffer from the disadvantage of the difficulty of evaporating the small molecule material without significant thermal degradation. In spin coating, the film produced is a composite of a molecularly doped polymer (MDP) wherein the small molecules are dispersed throughout either a polymer or electrolyte. The difficulty is controlling thickness in the few hundred angstrom range necessary to control turn-on voltage.

Hence, there is a need for a method of making MDP at a high deposition rate, without thermal degradation and with controlled thickness at any thickness including the few hundred angstrom range.

SUMMARY OF THE INVENTION

The present invention is a method of making a first solid composite polymer layer of polymer doped with light emitting material. The method has the steps of (a) flash evaporating a coating monomer together with light emitting material forming an evaporate; (b) cyrocondensing the evaporate onto a surface; and (c) crosslinking condensed evaporate. The evaporate may be passed to a glow discharge electrode creating a glow discharge monomer plasma from the evaporate; then (d) cryocondensing the glow discharge monomer plasma on a surface whereupon condensed glow discharge plasma as a liquid begins crosslinking. The crosslinking results from radicals created in the glow discharge plasma and achieves self curing.

It is, therefore, an object of the present invention to provide a method of making a composite polymer of polymer with light emitting material via flash evaporation.

An advantage is that the conjugation (if any) is preserved during curing. Another advantage of the present invention is that multiple layers of materials may be combined. For example, as recited in U.S. Pat. Nos. 5,547,508 and 5,395,644, 5,260,095, hereby incorporated by reference, multiple polymer layers, alternating layers of polymer and metal, and other layers may be made with the present invention in the vacuum environment.

An advantage of the present invention using plasma curing is insensitivity to a direction of motion of the substrate because the deposited monomer layer is self curing. Because of rapid self curing, the monomer has less time to flow and is therefore more uniformly thick. A further advantage is that the conjugation (if any) is preserved during curing.

The subject matter of the present invention is particularly pointed out and distinctly claimed in the concluding portion of this specification. However, both the organization and method of operation, together with further advantages and objects thereof, may best be understood by reference to the following detailed description in combination with the drawings wherein like reference characters refer to like elements.

DESCRIPTION OF THE PREFERRED EMBODIMENT(S)

Figure 1A:
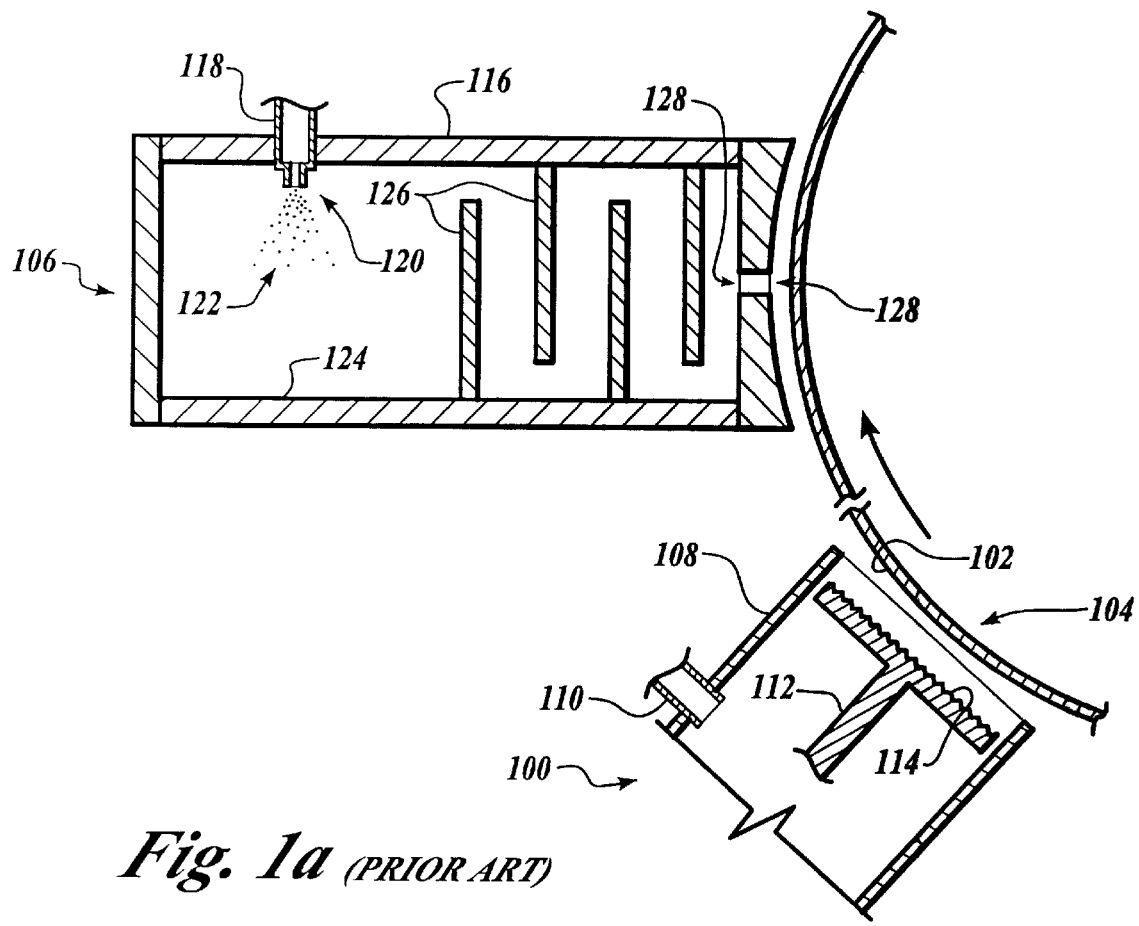
FIG. 1a is a cross section of a prior art combination of a glow discharge plasma generator with inorganic compounds with flash evaporation.
Figure 1B:
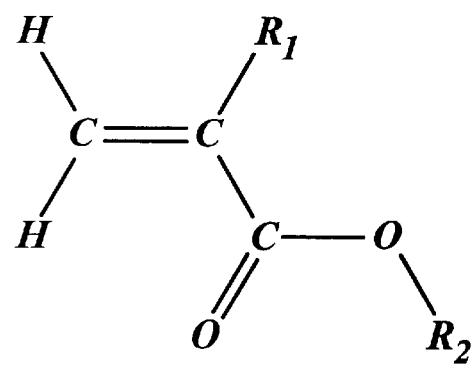
FIG. 1b is a chemical diagram of (meth)acrylate.
Figure 1C:
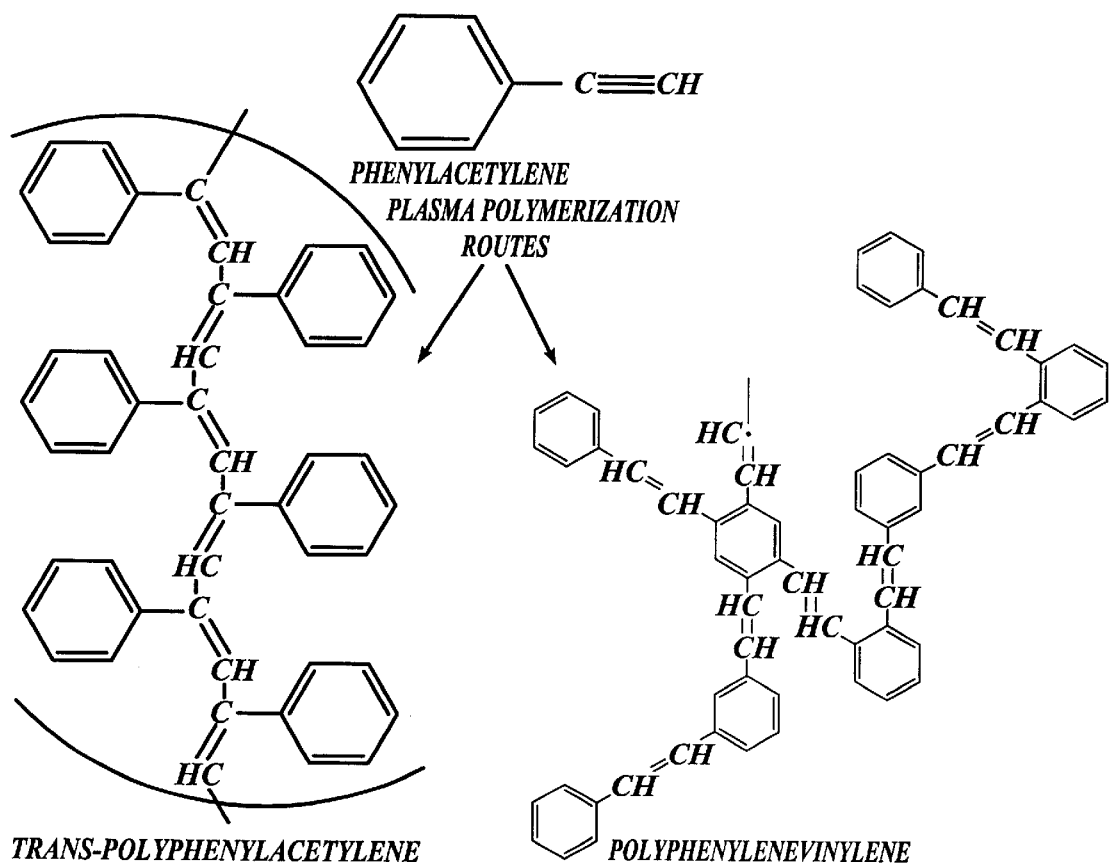
FIG. 1c is a chemical diagram of phenylacetylene.
Figure 1D:
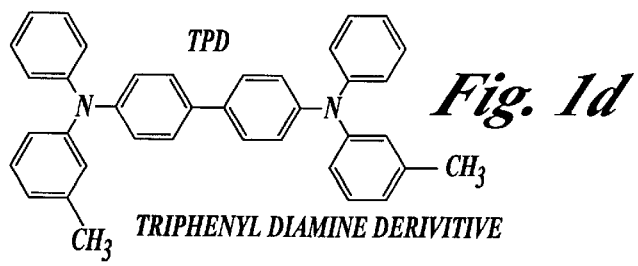
FIG. 1d is a chemical diagram of triphenyl diamine derivitive.
Figure 1E:
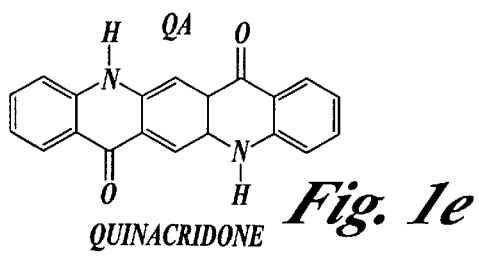
FIG. 1e is a chemical diagram of quinacridone.
Figure 1F:
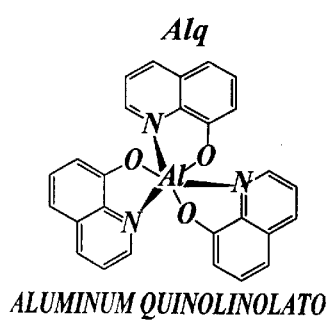
FIG. 1f is a chemical diagram of aluminum quinolinolato

According to the present invention, a first solid polymer composite layer is made by the steps of:
(a) mixing a liquid monomer with light emitting particles substantially insoluble in the liquid monomer forming a monomer particle mixture;
(b) flash evaporating the monomer particle mixture forming a composite vapor; and
(c) continuously cryocondensing the composite vapor on a cool substrate and cross linking a cryocondensed monomer layer thereby forming the composite polymer layer.

Flash evaporation has the steps:
(a) supplying a continuous liquid flow of the monomer particle mixture into a vacuum environment at a temperature below both the decomposition temperature and the polymerization temperature of the monomer particle mixture;
(b) continuously atomizing the monomer particle mixture into a continuous flow of droplets;
(c) continuously vaporizing the droplets by continuously contacting the droplets on a heated surface having a temperature at or above a boiling point of the liquid monomer and of the particles, but below a pyrolysis temperature, forming a composite vapor.

The light emitting organic molecules are introduced to the monomer as particles. During flash evaporation, both the monomer and the particles are vaporized. As a result of this vaporization, the light emitting organic molecules are then dispersed among the monomer molecules whereupon condensation or cryocondensation, the composite is formed wherein the light emitting organic molecules are distributed within the composite at a molecular level. In other words, the light emitting organic molecules are dispersed in a polymeric matrix.

Insoluble is defined as not dissolving. Substantially insoluble refers to any amount of a particle material not dissolved in the liquid monomer. Examples include solid particles that are insoluble or partially soluble in the liquid monomer, immiscible liquids that are fully or partially miscible/insoluble in the liquid monomer, and dissolvable solids that have a concentration greater than the solubility limit of the monomer so that an amount of the dissolvable solid remains undissolved.

The insoluble particles are preferably of a volume much less than about 5000 cubic micrometers (diameter about 21 micrometers) or equal thereto, preferably less than or equal to about 4 cubic micrometers (diameter about 2 micrometers). In a preferred embodiment, the insoluble particles are sufficiently small with respect to particle density and liquid monomer density and viscosity that the settling rate of the particles within the liquid monomer is several times greater than the amount of time to transport a portion of the particle liquid monomer mixture from a reservoir to the atomization nozzle. It is to be noted that it may be necessary to stir the particle liquid monomer mixture in the reservoir to maintain suspension of the particles and avoid settling.

Upon spraying, the droplets may be particles alone, particles surrounded by liquid monomer and liquid monomer alone. Since both the liquid monomer and the particles are evaporated, it is of no consequence either way. It is, however, important that the droplets be sufficiently small that they are completely vaporized. Accordingly, in a preferred embodiment, the droplet size may range from about 1 micrometer to about 50 micrometers.

After condensation, the cross linking may be by radiation curing or by self curing. In radiation curing (FIG. 1), the monomer liquid may include a photoinitiator. In self curing, a combined flash evaporator, glow discharge plasma generator is used without either the e-beam gun or ultraviolet light.

The mixture of monomer and insoluble or partially soluble particles may be considered a slurry, suspension or emulsion, and the particles may be solid or liquid. The mixture may be obtained by several methods. One method is to mix insoluble particles of a specified size into the monomer. The insoluble particles of a solid of a specified size may be obtained by direct purchase or by making them by one of any standard techniques, including but not limited to milling from large particles, precipitation from solution, melting/spraying under controlled atmospheres, rapid thermal decomposition of precursors from solution as described in U.S. Pat. No. 5,652,192 hereby incorporated by reference. The steps of U.S. Pat. No. 5,652,192 are making a solution of a soluble precursor in a solvent and flowing the solution through a reaction vessel, pressurizing and heating the flowing solution and forming substantially insoluble particles, then quenching the heated flowing solution and arresting growth of the particles. Alternatively, larger sizes of solid material may be mixed into liquid monomer then agitated, for example ultrasonically, to break the solid material into particles of sufficient size.

Liquid particles may be obtained by mixing an immiscible liquid with the monomer liquid and agitating by ultrasonic or mechanical mixing to produce liquid particles within the liquid monomer. Immiscible liquids include, for example phenylacetylene.

The liquid monomer may be any liquid monomer useful in flash evaporation for making polymer films. Liquid monomer includes but is not limited to meth(acrylate) monomer, for example tripropyleneglycol diacrylate, tetraethylene glycol diacrylate, tripropylene glycol monoacrylate, caprolactone acrylate and combinations thereof; methacrylate monomers; and combinations thereof. The (meth)acrylate monomers are particularly useful in making light emitting polymers (LEP).

The insoluble light emitting particle may be any insoluble or partially insoluble particle type having a boiling point below a temperature of the heated surface in the flash evaporation process. Insoluble light emitting particle includes but is not limited to conjugated material for example triphenyl diamine derivitive (TPD, FIG. 1d), quinacridone (QA, FIG. 1e), aluminum quinolinolato (Alq, FIG. 1f) and combinations thereof.

To achieve a light emitting composite, the insoluble particles may be on a molecular level within the matrix as a molecularly doped polymer (MDP) or may be multi-molecule particles within the matrix.

Figure 2:
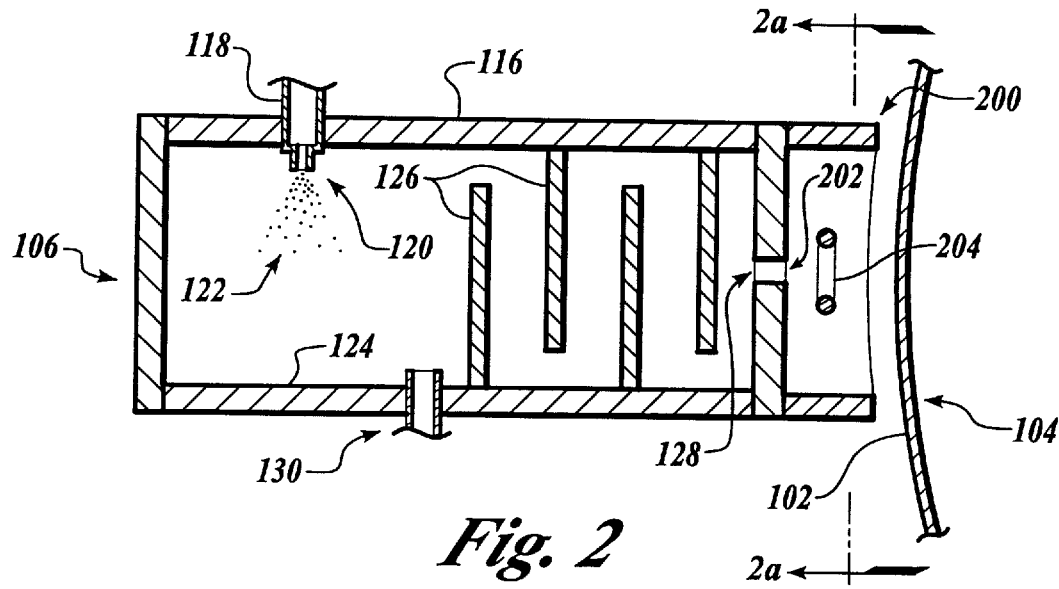
FIG. 2 is a cross section of the apparatus of the present invention of combined flash evaporation and glow discharge plasma deposition.

Making an LEP is done with the apparatus is shown in FIG. 2. The apparatus and method of the present invention are preferably within a low pressure (vacuum) environment or chamber. Pressures preferably range from about $10^{-1}$ torr to $10^{-6}$ torr. The flash evaporator 106 has a housing 116, with a monomer inlet 118 and an atomizing nozzle 120. Flow through the nozzle 120 is atomized into particles or droplets 122 which strike the heated surface 124 whereupon the particles or droplets 122 are flash evaporated into a gas or evaporate that flows past a series of baffles 126 to an evaporate outlet 128 and cryocondenses on the surface 102. Cryocondensation on the baffles 126 and other internal surfaces is prevented by heating the baffles 126 and other surfaces to a temperature in excess of a cryocondensation temperature or dew point of the evaporate. Although other gas flow distribution arrangements have been used, it has been found that the baffles 126 provide adequate gas flow distribution or uniformity while permitting ease of scaling up to large surfaces 102. Crosslinking is by radiation curing.

In another embodiment, the evaporate outlet 128 directs gas toward a glow discharge electrode 204 creating a glow discharge plasma from the evaporate. In the embodiment shown in FIG. 2, the glow discharge electrode 204 is placed in a glow discharge housing 200 having an evaporate inlet 202 proximate the evaporate outlet 128. In this embodiment, the glow discharge housing 200 and the glow discharge electrode 204 are maintained at a temperature above a dew point of the evaporate. The glow discharge plasma exits the glow discharge housing 200 and cryocondenses on the surface 102 of the substrate 104.

Figure 2A:
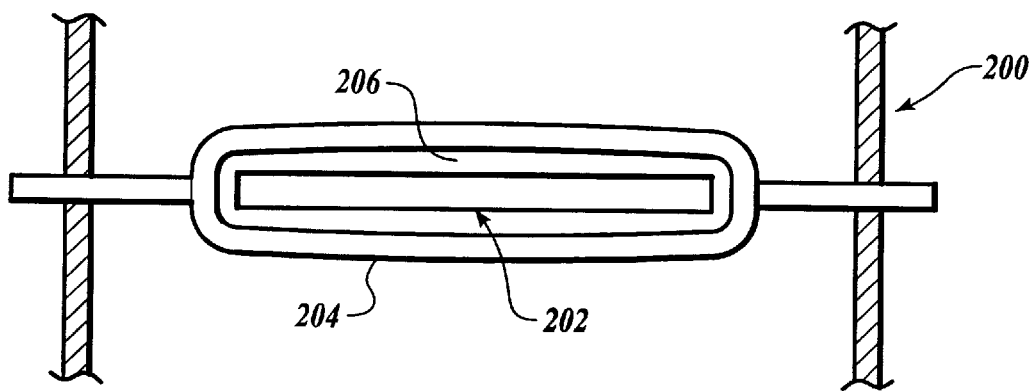
FIG. 2a is a cross section end view of the apparatus of the present invention.

In either embodiment, it is preferred that the substrate 104 is kept at a temperature below a dew point of the evaporate, preferably ambient temperature or cooled below ambient temperature to enhance the cryocondensation rate. In these embodiments, the substrate 104 is moving and may be electrically grounded, electrically floating or electrically biased.

Where glow discharge is used, and if the substrate 104 is electrically biased, it may even replace the electrode 204 and be, itself, the electrode which creates the glow discharge plasma from the monomer gas. Substantially not electrically biased means that there is no impressed voltage although a charge may build up due to static electricity or due to interaction with the plasma. A preferred shape of the glow discharge electrode 204, is shown in FIG. 2a. In this preferred embodiment, the glow discharge electrode 204 is separate from the substrate 104 and shaped so that evaporate flow from the evaporate inlet 202 substantially flows through an electrode opening 206. Any electrode shape can be used to create the glow discharge, however, the preferred shape of the electrode 204 does not shadow the plasma from the evaporate issuing from the outlet 202 and its symmetry, relative to the monomer exit slit 202 and substrate 104, provides uniformity of the evaporate vapor flow to the plasma across the width of the substrate while uniformity transverse to the width follows from the substrate motion.

The spacing of the electrode 204 from the substrate 104 is a gap or distance that permits the plasma to impinge upon the substrate. This distance that the plasma extends from the electrode will depend on the evaporate species, electrode 204/substrate 104 geometry, electrical voltage and frequency, and pressure in the standard way as described in detail in ELECTRICAL DISCHARGES IN GASSES, F. M. Penning, Gordon and Breach Science Publishers, 1965, and summarized in THIN FILM PROCESSES, J. L. Vossen, W. Kern, editors, Academic Press, 1978, Part II, Chapter II-1, Glow Discharge Sputter Deposition, both hereby incorporated by reference.

Figure 3:
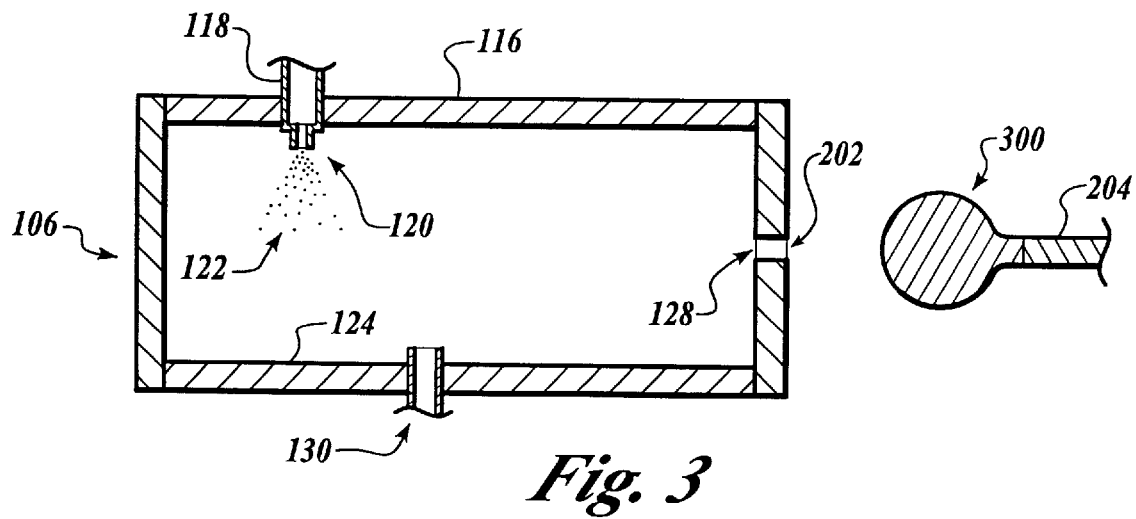
FIG. 3 is a cross section of the present invention wherein the substrate is the electrode.

A glow discharge apparatus suitable for batch operation is shown in FIG. 3. In this embodiment, the glow discharge electrode 204 is sufficiently proximate a part 300 (substrate) that the part 300 is an extension of or part of the electrode 204. Moreover, the part is below a dew point to allow cryocondensation of the glow discharge plasma on the part 300 and thereby coat the part 300 with the monomer condensate and self cure into a polymer layer. Sufficiently proximate be connected to, resting upon, in direct contact with, or separated by a gap or distance that permits the plasma to impinge upon the substrate. This distance that the plasma extends from the electrode will depend on the evaporate species, electrode 204/substrate 104 geometry, electrical voltage and frequency, and pressure in the standard way as described in ELECTRICAL DISCHARGES IN GASSES, F. M. Penning, Gordon and Breach Science Publishers, 1965, hereby incorporated by reference. The substrate 300 may be stationary or moving during cryocondensation. Moving includes rotation and translation and may be employed for controlling the thickness and uniformity of the monomer layer cryocondensed thereon. Because the cryocondensation occurs rapidly, within milli-seconds to seconds, the part may be removed after coating and before it exceeds a coating temperature limit.

In operation, either as a method for plasma enhanced chemical vapor deposition of low vapor pressure materials (coating material) onto a surface, or as a method for making polymer layers (especially PML), the method of the invention has the steps of (a) flash evaporating a coating material monomer forming an evaporate; (b) cryocondensing the evaporate onto a surface and (c) crosslinking the condensed evaporate. The crosslinking may be by radiation, for example e-beam or ultraviolet, by or self curing. Self curing is passing the evaporate to a glow discharge electrode creating a glow discharge monomer plasma from the evaporate; then cryocondensing the glow discharge monomer plasma on a substrate and crosslinking the glow discharge monomer plasma thereon. The crosslinking results from radicals created in the glow discharge plasma thereby permitting self curing.

The flash evaporating has the steps of flowing a coating material monomer to an inlet, atomizing the material through a nozzle and creating a plurality of monomer droplets of the monomer liquid as a spray. The spray is directed onto a heated evaporation surface whereupon it is evaporated and discharged through an evaporate outlet.

The coating material may be any liquid monomer. However, it is preferred that the liquid monomer or liquid have a low vapor pressure at ambient temperatures so that it will readily cryocondense. Preferably, the vapor pressure of the liquid monomer material is less than about 10 torr at 83° F. (28.3° C.), more preferably less than about 1 torr at 83° F. (28.3° C.), and most preferably less than about 10 millitorr at 83° F. (28.3° C.). Liquid monomer includes but is not limited to phenylacetylene (FIG. 1c), (meth)acrylate and combinations thereof.

When the monomer includes particles, the particle(s) may be any insoluble or partially insoluble particle type having a boiling point below a temperature of the heated surface in the flash evaporation process. Insoluble particle includes but is not limited to phenyl acetylene, triphenyl diamine derivitive (TPD, FIG. 1d), quinacridone (QA, FIG. 1e) and combinations thereof.

By using flash evaporation, the coating material monomer is vaporized so quickly that reactions that generally occur from heating a liquid material to an evaporation temperature simply do not occur. Further, control of the rate of evaporate delivery is strictly controlled by the rate of material delivery to the inlet 118 of the flash evaporator 106.

In the embodiment with a glow discharge electrode, additional gases may be added within the flash evaporator 106 through a gas inlet 130 upstream of the evaporate outlet 128, preferably between the heated surface 124 and the first baffle 126 nearest the heated surface 124. Additional gases may be organic or inorganic for purposes included but not limited to ballast, reaction and combinations thereof. Ballast refers to providing sufficient molecules to keep the plasma lit in circumstances of low evaporate flow rate. Reaction refers to chemical reaction to form a compound different from the evaporate. Additional gases include but are not limited to group VIII of the periodic table, hydrogen, oxygen, nitrogen, chlorine, bromine, polyatomic gases including for example carbon dioxide, carbon monoxide, water vapor, and combinations thereof.

EXAMPLE 1

An experiment was conducted to demonstrate the method of the present invention. The monomer was TRPGDA (tri-propylene glycol diacrylate). Several starting conditions were used as indicated in Table E1-1.

TABLE E1-1

| Starting Materials and Amounts | | | | |
|---|---|---|---|---|
| | Sample 1 | Sample 2 | Sample 3[A] | Sample 4 |
| Monomer | TRPGDA | TRPGDA | TRPGDA | TRPGDA |
| TPD (vol %) | 10 | 0 | 10 | 0 |
| Alq (vol %) | 0 | 10 | 10 | 0 |
| QA | 0 | 0 | 0 | 10 |

[A]includes 2 vol % lithium-trifluoromethanesulfonate ($CF_3SO_3Li$)

The monomer particle mixture was flash evaporated under a vacuum of 10–4 torr and condensed upon a substrate of PET moving at a rate between 0–100 ft/min. Curing was by UV, e-beam and self curing by exposure of the evaporate to a plasma prior to condensation.

CLOSURE

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

I claim:

1. A method of making a polymer composite of a molecularly doped polymer, the method comprising the steps of:
   (a) mixing a liquid monomer with light emitting particles substantially insoluble in the liquid monomer forming a monomer particle mixture, said particles having light emitting molecules;
   (b) flash evaporating the monomer particle mixture forming a composite vapor; and
   (c) continuously cryocondensing the composite vapor on a cool substrate and cross linking a cryocondensed monomer layer thereby forming the composite polymer layer of said molecularly doped polymer.

2. The method as recited in claim 1, wherein flash evaporating comprises the steps of:
   (a) supplying a continuous liquid flow of said monomer particle mixture into a vacuum environment at a temperature below both the decomposition temperature and the polymerization temperature of the monomer particle mixture;
   (b) continuously atomizing the monomer particle mixture into a continuous flow of droplets;
   (c) continuously vaporizing the droplets by continuously contacting the droplets on a heated surface having a temperature at or above a boiling point of the liquid monomer and of the particles, but below a pyrolysis temperature, forming said composite vapor.

3. The method as recited in claim 1, wherein said cross linking is radiation cross linking.

4. The method as recited in claim 1, further comprising the step of passing the composite vapor past a glow discharge electrode prior to cryocondensing, wherein said cross linking is self curing.

5. The method as recited in claim 1, wherein the liquid monomer is selected from the group consisting of (meth) acrylate monomers and combinations thereof.

6. The method as recited in claim 5, wherein acrylate monomer is selected from the group consisting of tripropyleneglycol diacrylate, tetraethylene glycol diacrylate, tripropylene glycol monoacrylate, caprolactone acrylate, and combinations thereof.

7. The method as recited in claim 1, wherein the light emitting particles are selected from the group consisting of organic solids, liquids, and combinations thereof.

8. The method as recited in claim 7, wherein the organic solids are selected from the group consisting of aluminum quinolinolato, triphenyl diamine derivitive, quinacridone, and combinations thereof.

* * * * *